US012748133B2

(12) United States Patent
Liu

(10) Patent No.: US 12,748,133 B2
(45) Date of Patent: Sep. 29, 2026

(54) ENERGY MEASUREMENT METER AND ENERGY MEASURING METHOD

(71) Applicant: Chicony Power Technology Co., Ltd., New Taipei City (TW)

(72) Inventor: Chun-Chi Liu, New Taipei City (TW)

(73) Assignee: Chicony Power Technology Co., Ltd., New Taipei City (TW)

(*) Notice: Subject to any disclaimer, the term of this patent is extended or adjusted under 35 U.S.C. 154(b) by 233 days.

(21) Appl. No.: 18/672,031

(22) Filed: May 23, 2024

(65) Prior Publication Data

US 2025/0277818 A1 Sep. 4, 2025

(30) Foreign Application Priority Data

Mar. 1, 2024 (TW) ................................ 113107599

(51) Int. Cl.
*G01R 11/17* (2006.01)
*G01R 11/57* (2006.01)

(52) U.S. Cl.
CPC .............. *G01R 11/17* (2013.01); *G01R 11/57* (2013.01)

(58) Field of Classification Search
CPC ................................ G01R 11/17; G01R 11/57
USPC .............................. 324/500, 600, 76.11, 140
See application file for complete search history.

(56) References Cited

U.S. PATENT DOCUMENTS 6,553,418 B1 * 4/2003 Collins ................... H04L 67/12 709/200
7,729,810 B2 * 6/2010 Bell .......................... H02J 3/00 706/15
9,467,754 B1 10/2016 Sparks et al.
9,689,901 B2 6/2017 Shamir et al.
10,184,963 B2 1/2019 Dawley et al.
10,426,068 B1 9/2019 Danielson
11,726,117 B2 8/2023 Meranda et al.
11,962,710 B2 * 4/2024 VandenBrekel ....... G06Q 40/04
2011/0202194 A1 * 8/2011 Kobraei ................. G06Q 50/06 702/62

(Continued)

FOREIGN PATENT DOCUMENTS

CN 202602355 U 12/2012
CN 105261192 A 1/2016

(Continued)

*Primary Examiner* — Huy Q Phan
*Assistant Examiner* — Trung Q Nguyen
(74) *Attorney, Agent, or Firm* — CKC & Partners Co., LLC

(57) ABSTRACT

An energy measurement meter, comprising a first measurement device and a processing device. The first measurement device comprises multiple measurement circuits to receive multiple first sensing signals, and convert the first sensing signals into multiple first sensing data. The processing device is communicatively connected to the first measurement device to receive the first sensing data. The first measurement device is further configured for: setting a first device code corresponding to the first measurement device and multiple channel codes corresponding to the measurement circuits; providing the first device code and the channel codes to the processing device; and providing the first sensing data to the processing device, so that the processing device records at least one part of the multiple first sensing data as multiple first energy data, wherein each first energy data corresponds to the first device code and a corresponding channel code.

21 Claims, 4 Drawing Sheets

(56) References Cited

U.S. PATENT DOCUMENTS

| | | | | |
|---|---|---|---|---|
| 2017/0063566 | A1* | 3/2017 | Seminario .............. | G01D 4/004 |
| 2017/0269127 | A1 | 9/2017 | Sykes et al. | |
| 2020/0182918 | A1* | 6/2020 | Trieste, Jr. ................ | G01J 5/00 |
| 2020/0257696 | A1* | 8/2020 | Varney ................... | G01D 4/004 |
| 2020/0292597 | A1* | 9/2020 | Minciunescu ......... | G01R 21/00 |

FOREIGN PATENT DOCUMENTS

| | | | |
|---|---|---|---|
| CN | 110568252 | A | 12/2019 |
| CN | 112305304 | A | 2/2021 |
| CN | 116266331 | A | 6/2023 |
| CN | 116996794 | A | 11/2023 |
| TW | I483564 | B | 5/2015 |
| TW | I683109 | B | 1/2020 |
| WO | 2021/135177 | A1 | 7/2021 |

* cited by examiner

ENERGY MEASUREMENT METER AND ENERGY MEASURING METHOD

CROSS-REFERENCE TO RELATED APPLICATION

This application claims priority to Taiwan Application Serial Number 113107599, filed Mar. 1, 2024, which is herein incorporated by reference in its entirety.

BACKGROUND

Technical Field

The present disclosure relates to energy measurement technology, particularly an energy measurement meter and energy measuring method.

Description of Related Art

With the increasingly severity of global warming and the accelerated depletion of energy resources, "energy saving and carbon reduction" has become an issue that has received more and more attention in recent years. From the government to businesses, efforts have been devoted to developing green energy to create a sustainable low-carbon society and economy.

To achieve the goal of energy saving and carbon reduction, it is essential to have a clear understanding of the historical records of energy consumption in order to identify how to improve energy efficiency issues. Therefore, designing an energy measurement device that can be applied to different energy-consuming equipment and environments has become a major challenge currently.

SUMMARY

One aspect of the present disclosure is an energy measurement meter, comprising a first measurement device and a processing device. The first measurement device comprises a plurality of measurement circuits. The plurality of measurement circuits is coupled to a plurality of sensors through a plurality of input ports to receive a plurality of first sensing signals, and the plurality of measurement circuits is configured to convert the plurality of first sensing signals into a plurality of first sensing data. The processing device is communicatively connected to the first measurement device to receive the plurality of first sensing data from the first measurement device. The first measurement device is further configured for: setting a first device code corresponding to the first measurement device and a plurality of channel codes corresponding to the plurality of measurement circuits; providing the first device code and the plurality of channel codes to the processing device when communicatively connecting to the processing device; and providing the plurality of first sensing data to the processing device, so that the processing device records at least one part of the plurality of first sensing data as a plurality of first energy data, wherein each of the plurality of first energy data corresponds to the first device code and a corresponding one of the plurality of channel codes.

Another aspect of the present disclosure is an energy measuring method, comprising: when a processing device is communicatively connected to a first measurement device, setting a first device code corresponding to the first measurement device and setting a plurality of channel codes corresponding to a plurality of measurement circuits of the first measurement device; converting, by the first measurement device, a plurality of first sensing signals provided by a plurality of sensors into a plurality of first sensing data; receiving, by the processing device, the plurality of first sensing data, and identifying the first measurement device and the plurality of measurement circuits according to the first device code and the plurality of channel codes; and recording at least one part of the plurality of first sensing data as a plurality of first energy data, wherein each of the plurality of first energy data corresponds to the first device code and a corresponding one of the plurality of channel codes.

Another aspect of the present disclosure is an energy measurement meter, comprising a measurement device and a processing device. The measurement device comprises a plurality of measurement circuits. The plurality of measurement circuits is coupled to a power sensor (or multiple power sensors) and an analog sensor (or multiple analog sensors) through a plurality of input ports, so as to receive a power sensing signal and an analog sensing signal. The measurement device is configured to convert the power sensing signal and the analog sensing signal into a plurality of sensing data. The processing device is communicatively connected to the measurement device to receive the plurality of sensing data from the measurement device. When the processing device is communicatively connected to the measurement device, the energy measurement meter is configured to set a device code corresponding to the measurement device and a plurality of channel codes corresponding to the plurality of measurement circuits. The processing device is configured to record at least one part of the plurality of sensing data as a plurality of energy data. Each of the plurality of energy data corresponds to the device code and a corresponding one of the plurality of channel codes.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

The present disclosure relates to an energy measurement meter, which is configured to record energy consumption data of various load devices. The energy measurement meter may be couple to a sensor arranged on a load device. When the sensor detects the operation status of the load device to obtain a sensing signal, the sensor transmits the sensing signal to the energy measurement meter.

For different types of load devices, sensing signal provided by sensor may not be the same. Taking a load device related to power supply as an example, the signal type showing an energy consumption status may be "voltage" or "current". Voltage and current are two electrical characteristics that correspond to each other, and the energy measurement meter needs to receive and identify the sensing signal by specific specifications or circuits. Sensor that detects an electrical/power signal is called "power sensor".

On the other hand, there are also other load devices that are not related to electrical energy, sensing signal provided by sensor arranged on these load devices (e.g., water flow meter, gas flow meter or oil flow meter) is analog signal. Analog signal provided by analog sensor also needs to be received and identified by specific energy measurement meter (analog flow meter).

As mentioned above, for different types of load devices, the sensing signals obtained by different sensors are not the same. Therefore, it needs to set different energy measurement meters for each type of load devices. However, this method is difficult to integrate various types of sensing signals, and the setup cost is too high.

Figure 1:
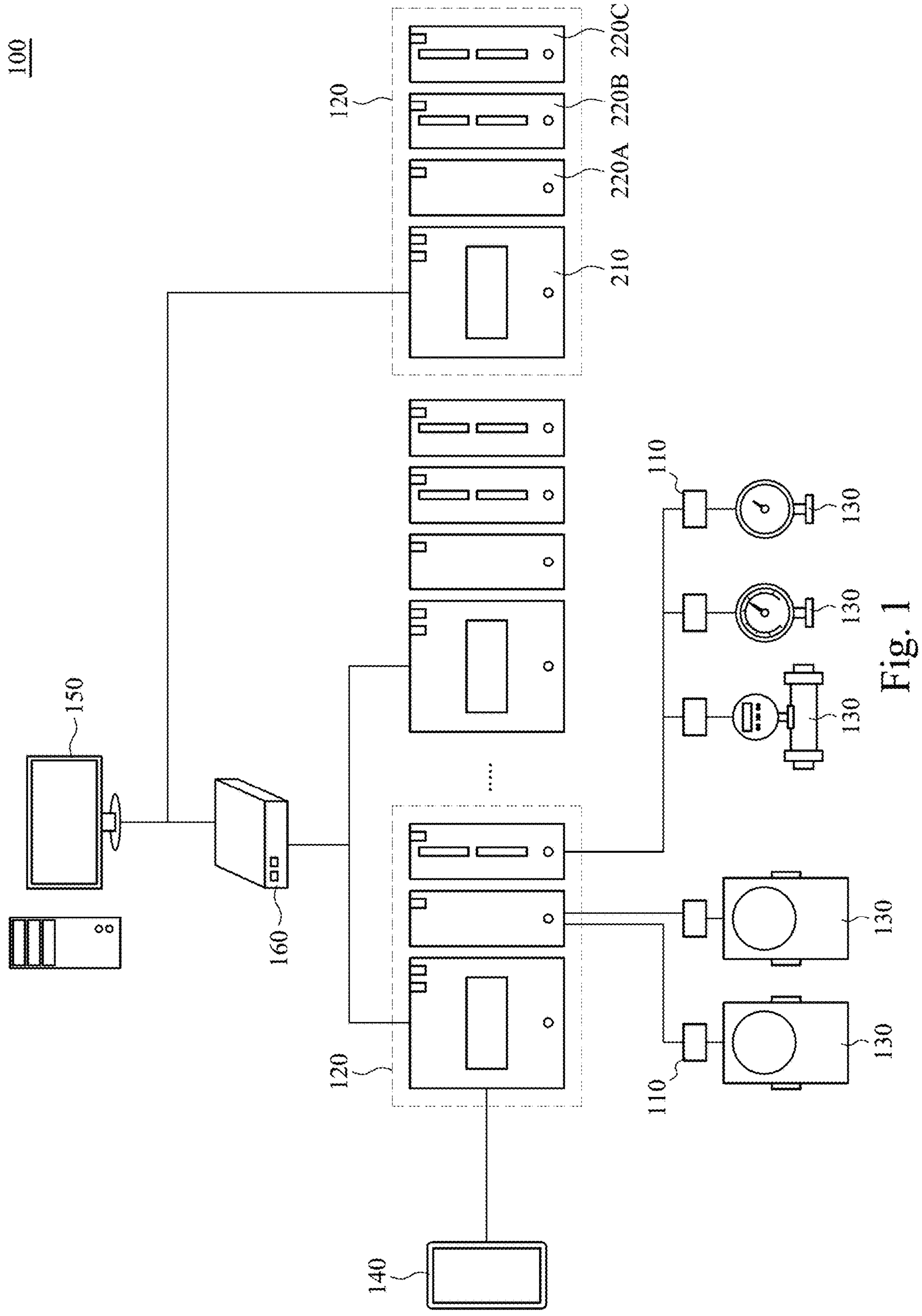
FIG. 1 is a schematic diagram of an energy management system in some embodiments of the present disclosure.

FIG. 1 is a schematic diagram of an energy management system 100 in some embodiments of the present disclosure. The energy management system 100 include multiple sensors 110 and multiple energy measurement meters 120. Each of the sensors 110 is respectively arranged on different load devices 130, so as to detect operation status of the load devices 130 and obtain a corresponding sensing signal. Each energy measurement meter 120 is coupled to one or more sensors 110, so as to receive the sensing signal(s) provided by the sensor(s) 110. The multiple sensors 110 can include a power sensor and/or an analog sensor (e.g., analog flow meter).

In one embodiment, the energy management system 100 further includes a control device 140, a management server 150 and a network equipment 160. The control device 140 may be a portable device (e.g., smartphone), and is communicatively connected to the energy measurement meters 120, so as to manage the energy measurement meters 120 (e.g., access data and set detection parameters). The management server 150 is communicatively connected to the energy measurement meters 120 in a wired or wireless manner, so as to receive all data (e.g., backup data) obtained by the energy measurement meters 120 for users to check at any time. As shown in FIG. 1, the energy measurement meter 120 is indirectly connected to the management server 150 through the network equipment 160, or directly connected to the management server 150. Since those skilled in the art can understand the method of transmitting information between devices through communication technology, and thus they are not further detailed herein.

Figure 2:
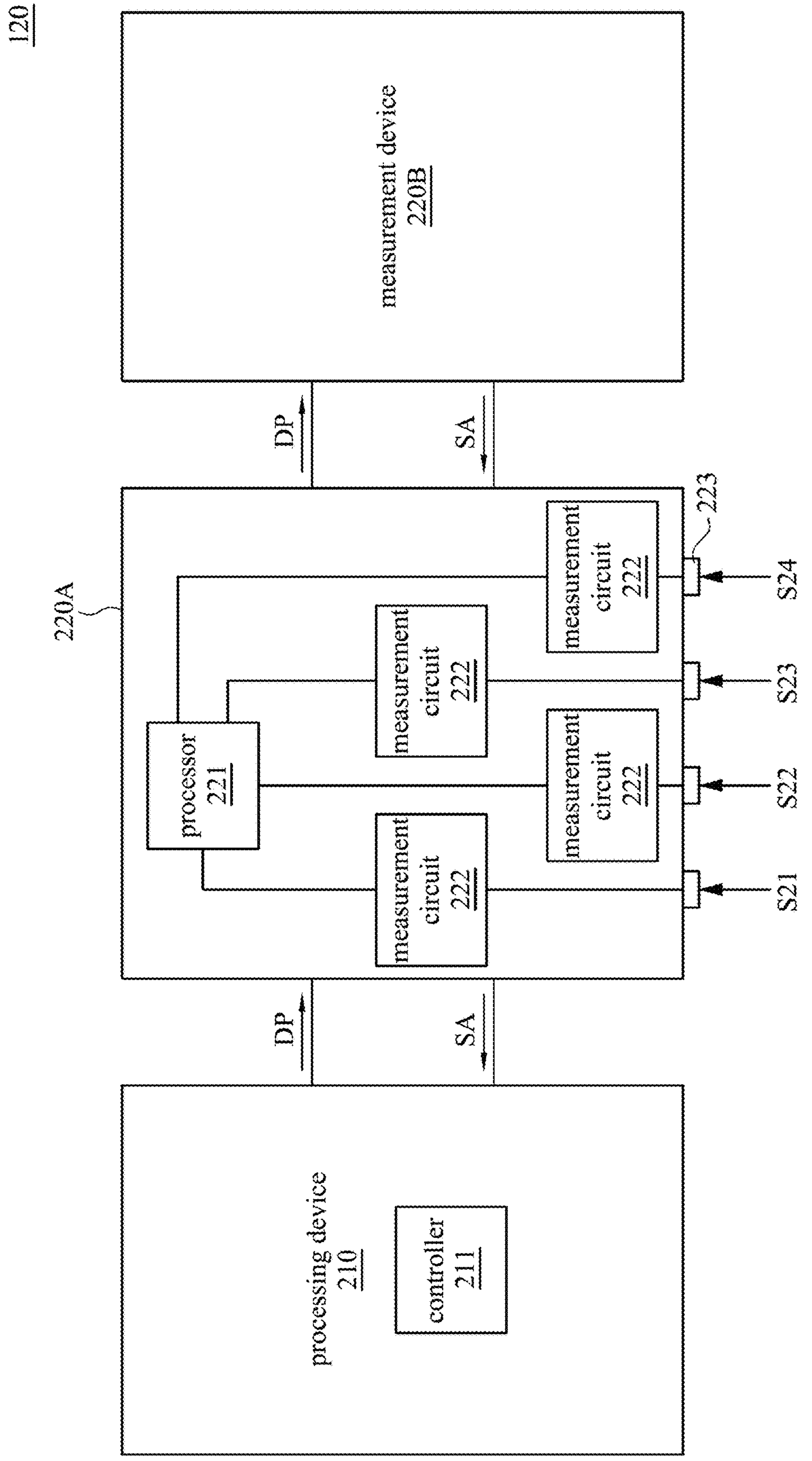
FIG. 2 is a schematic diagram of an energy measurement meter in some embodiments of the present disclosure.

FIG. 2 is a schematic diagram of an energy measurement meter 120 in some embodiments of the present disclosure. Referring to FIG. 1 and FIG. 2, in one embodiment, one of the energy measurement meters 120 includes a processing device 210 and one or more measurement devices 220A-220C. The processing device 210 is communicatively connected to the measurement devices 220A-220C, and is configured to receive sensing data SA uploaded by the measurement devices 220A-220B. A controller 211 of the processing device 210 is configured to analyze the sensing data SA to record as an energy data. The identification and analysis process of the processing device 210 is detailed in subsequent paragraphs.

The measurement devices 220A-220C may coupled to each other in series, and are integrated with the processing device 210. For example, the energy measurement meter 120 include two measurement devices: a first measurement device 220A is arranged on the processing device 210, a second measurement device 220B is arranged on the first measurement device 220A. In other words, each of the measurement devices 220A-220C can be assembled or disassembled by manner of "expansion module". In order to keep the diagram simple, "two measurement devices" are used as an example in FIG. 2 for illustration.

Specifically, each measurement device includes a processor 221, multiple measurement circuits 222 and multiple input ports 223. The processor 221 is communicatively connected to a controller 211 of the processing device 210. Each of the measurement circuits 222 corresponds to and is coupled to the respective input ports 223, so as to obtain the corresponding sensing signal (S21-S24) uploaded by sensor. Each measurement device converts the received sensing signal into a sensing data SA.

It should be emphasized that internal circuit of the measurement circuit 222 and/or interface of the input ports 223 may be different in each the measurement device. For example, the first measurement device 220A is coupled to a power sensor, so input ports of the first measurement device 220A may be USB (Universal Serial Bus). The second measurement device 220B is coupled to an analog sensor, so input ports of the second measurement device 220B can be a specialized analog signal connector.

In one embodiment, the sensing signals S21-S24 may be voltage signal, the first measurement device 220A divides the voltage signal through internal voltage dividing resistor so that the voltage signal is converted into an operating voltage range that complies with the processor 221. The conversion method for the sensing signal of the first measurement device 220A is not limited to the aforementioned voltage dividing circuit. In other embodiments, the first measurement device 220A can filter noise of the sensing signals S21-S24 through an internal filter circuit to generate the sensing data SA. In addition to the aforementioned voltage dividing circuit, filter circuit and combination thereof, the first measurement device 220A can also include level shifter, voltage stabilizing components, etc.

In one embodiment, the processing device 210 is further configured to provide a driving power DP to each of the measurement devices 220A-220C, so that the measurement devices 220A-220C operate according to the driving power DP and generate the sensing data SA. The present disclosure is not limited to this. In other embodiments, each of the measurement devices 220A-220C may also be provided with a battery, or be coupled to a power supply network to obtain the driving power DP.

The present disclosure uses the manner of "expansion module" to assemble energy measurement meters 120, so it can be applied to different types of load devices 130 and sensors 110. In addition, the received data can be integrated and recorded by the processing device 210, so each of the measurement devices 220A-220C does not need to be configured with complicated internal circuits, which facilitates control of installation costs and provides better setup flexibility and management convenience. In other words, with a single type of the energy measurement meter 120, different types of energy data (e.g., electricity, water, oil, gas) can be clearly recorded.

When each of the measurement devices 220A-220C is activated, each of the measurement devices 220A-220C sets its own device code, and at the same time sets multiple channel codes, each of the channel codes corresponds to each of the input ports 223. In one embodiment, the device code and the channel codes can be set through an input device (e.g., keyboard) of the processing device or the measurement device, or through the control device 140 to remotely connect to the measurement devices.

When the processing device 210 is communicatively connected to each of the measurement devices 220A-220C, each of the measurement devices 220A-220C transmits the device code and the channel codes to the processing device 210. Accordingly, when each of the measurement devices 220A-220C transmits the obtained sensing data to the processing device 210 subsequently, the processing device 210 can identify each of the measurement devices 220A-220C according to the device code, and can record and classify the sensing data according to the channel codes (e.g., collect data of the same sensor in the same file).

In one embodiment, in addition to display each sensing data (e.g., by a display panel), the processing device 210 can selectively store the received sensing data. The processing device 210 records at least one part of the sensing data as an energy data, and each energy data corresponds to the device code and a corresponding one of the channel codes.

The energy measurement meter 120 and the applied energy management system 100 in the present disclosure has multiple functions, such as "Data Integrating", "Data Filtering", "System Monitoring" and "Modular Configuring". It will be explained in sequence paragraphs.

Figure 3:
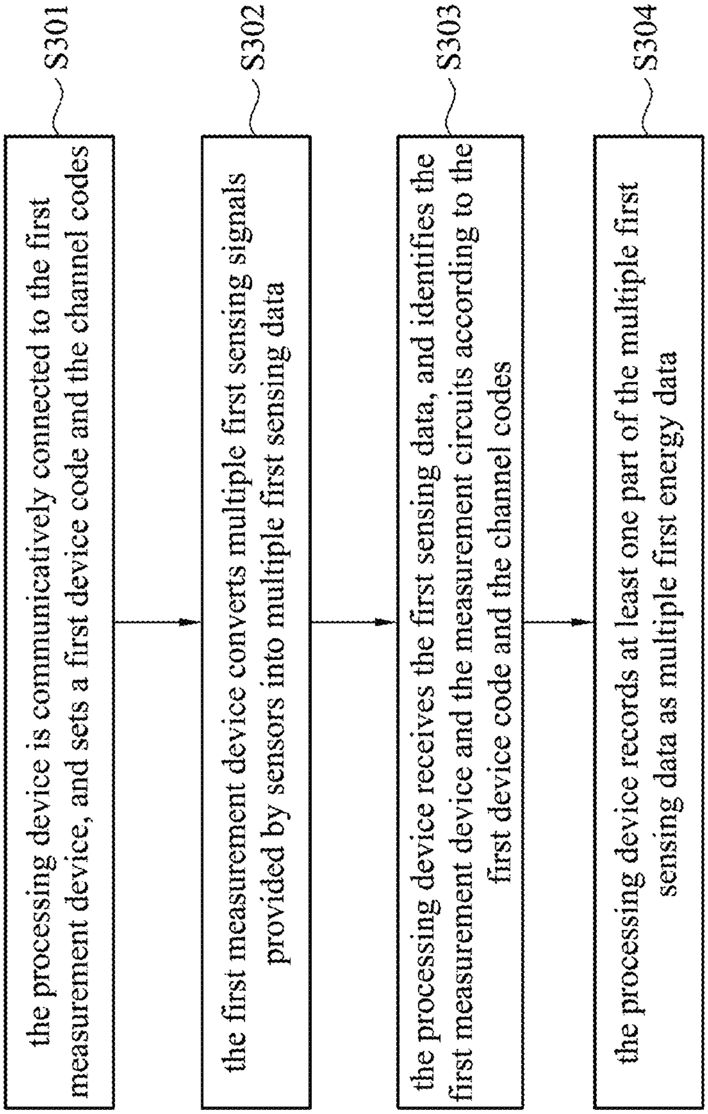
FIG. 3 is a flowchart of data integrating in some embodiments of the present disclosure.

First, it is explained the function "Data Integrating" of the energy measurement meter 120. FIG. 3 is a flowchart of data integrating in some embodiments of the present disclosure. In step S301, the processing device 210 is communicatively connected to the first measurement device 220A, and is configured to set a first device code corresponding to the first measurement device 220A, and set multiple first channel codes corresponding to the input ports 223 of the first measurement device 220A.

In step S302, the first measurement device 220A receives multiple first sensing signals S21-S24 provided by the sensors 110 through the input ports 223. Then, the first measurement device 220A converts the first sensing signals S21-S24 into multiple first sensing data SA by each measurement circuit 222 and the processor 221. As mentioned above, the first sensing signals S21-S24 include a power sensing signal and/or an analog sensing signal. In one embodiment, the sensing data SA further includes a corresponding signal type and a timestamp.

In one embodiment, the first sensing signals S21-S24 are transmitted to the first measurement device 220A in the form of electrical signals. In other words, the first sensing signals S21-S24 form sensing voltages on the input ports 223. The sensing voltage may be a digital signal or an analog signal, and each measurement circuit 222 is configured to convert the corresponding sensing voltage to generate a corresponding sensing data.

In step S303, the processing device 210 receives the first sensing data SA, and indentifies the first measurement device 220A and each measurement circuit 222 (or input port 223) according to the first device code and the corresponding one of the channel codes. In step S304, the processing device 210 records at least one part of multiple first sensing data as multiple first energy data according to the first device code and the first channel codes, so that each of the first energy data can correspond to the first device code and the corresponding channel code.

In one embodiment, after the processing device 210 obtains the first device code of the first measurement device 220A, the processing device 210 establishes a tag corresponding to the first device code internally, so as to record the state of the first device code. If the first device code is set to an enable state (e.g., tag "ON"), it represents that the first measurement device 220A has been set up and is operating normally. If the first device code is set to an disable state (e.g., tag "OFF"), it represents that the first measurement device 220A is in an inactive state (e.g., abnormal, removed or not configured yet). Similarly, the first measurement device 220A also can set a tag corresponding to the first device code internally, so as to record the state of the first device code. The method of "identifying the state of the device code" will be explained in subsequent paragraphs describing the "Modular Configuring" function.

The following explains that the measurement circuit 222 converts the corresponding first sensing signal into the first sensing data SA in above step S302. In one embodiment, each of the measurement circuits 222 includes multiple measurement subcircuits to process different types of signals. In addition, the measurement device can be set in one of multiple different measurement modes. Each of the measurement modes corresponds to one or more specific measurement parameter(s), a specific signal type, a specific expected measurement signal range and a specific measurable data range. The expected measurement signal range of each measurement mode is based on the corresponding sensor 110 (the load device 130), so expected measurement signal ranges of multiple measurement modes will be different. The measurement device may selectively use one or more measurement subcircuits to process the sensing signal according to the different measurement mode.

As mentioned above, for example, when the first measurement device 220A sets the input ports 223 and the corresponding measurement circuit 222 to a "voltage mode", the corresponding measurement circuit 222 receives the sensing signal through a voltage measurement subcircuit corresponding to the voltage mode, so as to convert the sensing signal into a sensing data through voltage division and filtering. Then, the processor 221 determines whether the sensing data matches to the expected measurement signal range of the voltage mode. For example, if the sensing data is "5 volts", and the expected measurement signal range of the voltage mode is "2 volts to 10 volts", it means that the sensing data is correct to the voltage measurement subcircuit.

Similarly, when the first measurement device 220A sets the input ports 223 and the corresponding measurement circuit 222 to a "current mode" or a "temperature mode (NTC mode)", the measurement circuit 222 receives the sensing signal through corresponding measurement subcircuit(s), so that the converted sensing data matches the expected measurement signal range of the current mode or the temperature mode.

In some embodiments, the processor 221 of the measurement device can preset one of the measurement modes as the default mode (e.g., the voltage mode). When the sensing data is generated with the default mode, but the sensing data does not match the expected measurement signal range, the processor 221 automatically changes to another mode. Accordingly, it will automatically find the correct measurement mode to generate the sensing data.

In addition, in some embodiments, when the sensing signal is an analog sensing signal, the measurement device performs a series of analog-to-digital and digital-to-analog conversion(s) on the analog sensing signal according to a sampling accuracy, a measurement parameter(s), a signal type, an expected measurement signal range and a measurable data range corresponding to the measurement mode, so as to quantify and encode data in analog form into data in digital form. Generally, the analog sensing signal is used to record signals such as water flow, gas flow or oil flow, but the present disclosure is not limited to this.

In one embodiment, the measurement device converts the analog sensing signal into an analog sensing data, and then sample the analog sensing data according to the sampling accuracy to generate a digital sensing data. The digital sensing data corresponds to one of the signal types, such as water flow, gas flow or oil flow. Then, the measurement device performs another calculation on the digital sensing data according to the sampling accuracy and the measurement parameter of the corresponding measurement mode. The calculation result is used as the sensing data to be provided to the processing device 210. For example, the expected measurement signal range is "0.5 volts to 10.5 volts", and an input value of the analog sensing signal received by the measurement circuit 222 is "2.5 volts". After conversion by the measurement circuit 222 (e.g., voltage dividing process, or multiplying the input value of the analog sensing signal by a conversion factor of 0.5), the obtained analog sensing data is "1.25 volts". Since the analog signal is a dynamically changing data, the processor 221 needs to sample the analog sensing data for a period of time according to the sampling accuracy corresponding to the current measurement mode (e.g., the voltage mode), so as to generate the first digital sensing data. For example, in the voltage mode, the sampling accuracy is 12-bit (i.e., 4096 steps), and a reference voltage of the measurement circuit 222 is 5.5 volts (i.e., the measurement parameter). Then, after the analog sensing data "1.25 volts" is processed by the processor 221, a first digital sensing data "931" will be generated (the calculation method is: "(1.25/5.5)×4096").

As mentioned above, after generating the first digital sensing data, the processor 221 further calculates the first digital sensing data according to the sampling accuracy and the measurement parameter(s) of the current measurement mode, so as to determine whether the first digital sensing data matches the expected measurement signal range. As mentioned in the previous embodiment, in the voltage mode, the sampling accuracy is 12-bit (i.e., 4096 steps), and a reference voltage of the measurement circuit 222 is 5.5 volts (i.e., the measurement parameter), the sensing signal conversion coefficient is 0.5. If the first digital sensing data generated by sampling is "931", then the processor 221 calculates "(931/4096)×5.5/0.5" and the result is "2.5". This result will be equal to the input value of the analog sensing signal received by the measurement device, and conform/match to the expected measurement signal range of the voltage mode (e.g., 0.5-10.5 volts).

After confirming the expected measurement signal range is matched, the processor 221 calculates the restored input analog sensing signal value, which is calculated from the first digital sensing data, according to the sampling accuracy and the expected measurement signal range of the current measurement mode, so as to obtain a second digital sensing data. As mentioned in the previous embodiment, in the voltage mode, the sampling accuracy is 12-bit (i.e., 4096 steps), and the expected measurement signal range is 0.5-10.5 volts, and the restored input value of the analog sensing signal is "2.5 volts". After being processed by the processor 221, the generated second digital sensing data is "819" (e.g., the calculation method is "(2.5−0.5)/(10.5−0.5)×4096").

Finally, the processor 221 further calculates the second digital sensing data according to the sampling accuracy and the measurement parameter of the current measurement mode, and the result is used as the sensing data provided to the processing device 210. For example, in the voltage mode, the sampling accuracy is 12-bit (i.e., 4096 orders), and the signal type corresponding to the analog sensing signal is water flow. The measurable data range (flow range) is "0.5-20.5 $m^3/h$". If the second digital sensing data generated by sampling is "819", then the processor 221 calculates "(819/4096)×(20.5−0.5)+0.5" and the result is "4.5 $m^3/h$", so the sensing data can be recorded as water flow rate "4.5 $m^3/h$".

In addition, in one embodiment, the sensing data can be an instant flow value. Therefore, the processor 221 can also collect/accumulate the sensing data for a period of time, and store the accumulated result as another accumulated data. The processor 221 can also provided the accumulated data to the processing device 210.

In some embodiments, the processing device 210 stores multiple carbon emission coefficients, each of the carbon emission coefficients corresponds to one of the signal types. Since the carbon emission coefficients are related to energy suppliers, supply periods and other factors, in one embodiment, the carbon emission coefficients also correspond to each of the device code and the channel codes, and can correspond to a specific time period. After generating the energy data, the processing device 210 can calculate each of the energy data (first energy data and/or second energy data) and the corresponding one of the carbon emission coefficients to obtain a carbon emission data. Accordingly, users will be able to confirm carbon emission data clearly and directly.

It is explained the function "Data Filtering" of the energy measurement meter 120. In one embodiment, according to a data filter stored in the processing device 210, the processing device 210 selectively records at least one part of the sensing data as the energy data corresponding to one of the signal types. "Data filter" is used to filter data, which can be a filter, a program, or data including multiple filtering information. In other words, the processing device 210 is configured to analyze the sensing data, and determine whether each of the sensing data needs to be stored in a database as an energy data, or whether the sensing data is routine information and does not need to be stored.

Taking the first measurement device 220A as an example, when the processing device 210 is communicatively connected to the first measurement device 220A, the energy measurement meter 120 sets a first data filter corresponding to the first measurement device 220A. This setting action can be performed by the controller 211, the processor 221, or by the control device 140 remotely. The first data filter is stored in the processing device 210, but the same first data filter can also be stored in the first measurement device 220A. After the first data filter is set, the first device code in the processing device and the first measurement device will be set to the enable state.

The first data filter includes multiple signal types and corresponding multiple data storing criteria. The processing device 210 is configured to record the sensing data as the energy data according to the signal type and the corresponding data storing criteria. Each energy data further includes the corresponding device code and the channel codes.

The following is an example of the first data filter:

| signal type | filtering threshold | data storing criteria. |
|---|---|---|
| active power consumption | | stores the cumulative active power consumption every 15 minutes. |
| voltage | a high voltage threshold, a low voltage threshold | stores data, which is greater than the high voltage threshold or less than the low voltage threshold, and issues a high-voltage/low-voltage warning;<br>collects and stores the highest and lowest voltage values for each month. |
| current | a high current threshold | stores data, which is greater than the high current threshold, and issues a high-current warning;<br>collects and stores the highest current value per month. |
| frequency | | collects and stores the highest and lowest frequency values per month. |
| active power | a high active power threshold, a low active power threshold | stores data, which is greater than the high active power threshold or less than the low active power threshold;<br>collects and stores the highest and lowest active power for each month. |
| reactive power | a high reactive power threshold, a low reactive power threshold | stores data, which is greater than the high reactive power threshold or less than the low reactive power threshold;<br>collects and stores the highest and lowest reactive power for each month. |
| apparent power | a high apparent power threshold, a low apparent power threshold | stores data, which is greater than the high apparent power threshold or less than the low apparent power threshold;<br>collects and stores the highest and lowest apparent power for each month. |
| power factor | a low power factor threshold, a low power factor warning threshold | stores data, which is less than the low power factor threshold;<br>collects and stores the lowest power factor per month;<br>when the number of data less than the low power factor threshold in a month is larger than the low power factor warning threshold, issues a low-power-factor warning. |
| active power demand<br>reactive power demand<br>apparent power demand | | stores the cumulative active/reactive/apparent power demand every 15 minutes;<br>collects and stores the highest active/reactive/apparent power demand per month (accumulated every 15 minutes). |
| current demand | | stores the cumulative current demand every 15 minutes;<br>collects and stores the highest current demand per month (accumulated every 15 minutes). |
| total harmonic distortion of voltage<br>total harmonic distortion of current | a high harmonic distortion threshold, a high harmonic distortion warning threshold | stores all data greater than the high harmonic distortion threshold;<br>collects and stores the highest harmonic distortion values of voltage and current per month;<br>when the number of data larger than the high harmonic distortion threshold in a month is greater than the high harmonic distortion warning threshold, issues a high-harmonic-distortion-voltage or high-harmonic-distortion-current warning. |
| cumulative power consumption | | stores a total cumulative power consumption, a yearly cumulative power consumption, a cumulative power consumption of this month, a cumulative power consumption of this day. |

-continued

| signal type | filtering threshold | data storing criteria. |
| --- | --- | --- |
| cumulative carbon emissions | | a total cumulative carbon emissions, a yearly cumulative carbon emissions, a cumulative carbon emissions of this month, a cumulative carbon emissions of this day. |
| cumulative operation time | an equipment rated value | accumulates the time when current value is greater than 1% of the equipment rated value for cumulative operation time. stores a total cumulative operation time, a yearly cumulative operation time, a cumulative operation time of this month, a cumulative operation time of this day. |
| equipment power efficiency | a low equipment power efficiency threshold, a low equipment power efficiency warning threshold | the equipment power efficiency is defined as cumulative power consumption divided by cumulative operation time; collects and stores the average equipment power efficiency per month; collects and stores data, which is less than the low equipment power efficiency threshold; calculates and stores a lowest equipment power efficiency per month; when the number of data less than the low equipment power efficiency threshold per month is larger than the low equipment power efficiency warning threshold, issues a low-equipment-power-efficiency warning. |

The following is another example of the first data filter:

| signal type | filtering threshold | data storing criteria. |
| --- | --- | --- |
| instant water consumption, gas consumption, oil consumption | | stores the cumulative water/gas/oil consumption every 15 minutes; collects and stores the highest water/gas/oil consumption per month (accumulated every 15 minutes). |
| cumulative water consumption, gas consumption, oil consumption | | stores a total cumulative water/gas/oil consumption, a yearly cumulative water/gas/oil consumption, a cumulative water/gas/oil consumption of this month, a cumulative water/gas/oil consumption of this day. |
| cumulative carbon emissions | | a total cumulative carbon emissions, a yearly cumulative carbon emissions, a cumulative carbon emissions of this month, a cumulative carbon emissions of this day. |
| off-peak water consumption | off-peak time period a high leakage threshold (average water consumption per hour) | collects and stores an average water consumption per hour during the off-peak time; stores data greater than the high leakage threshold during the off-peak time; when the number of data greater than the high leakage threshold is greater than or equal to half of the number of data in the off-peak time, issues a suspected-water-leakage warning. |

As shown in the above tables, each of the signal types has a corresponding data storing criteria, and each of the criteria can correspond to one or more filtering threshold values. The measurement devices 220A-220C can classify the generated sensing data according to the signal types in the data filter, so that each sensing data is marked with the corresponding signal type and the corresponding filtering threshold value. In other words, the sensing data provided by the measurement devices 220A-220C to the processing device 210 has recorded the signal type. Therefore, the processing device 210 can directly analyze the sensing data.

In one embodiment, the processing device 210 stores the received sensing data in a register so that user can browse it in real time through a display screen of the processing device 210 or the control device 140. In addition, the processing device 210 is further configured to determine whether the sensing data matches to a corresponding filtering threshold value of the data storing criteria. If the sensing data matches to the filtering threshold value and the data storing criteria, it represent that the sensing data is significant, and the processing device 210 records the sensing data as an energy data. Since the energy data is filtered from the sensing data, the energy data will correspond to the same signal type.

It is explained the function "System Monitoring" of the energy measurement meter 120. As shown in FIG. 1 and FIG. 2, in one embodiment, the energy measurement meter 120 includes a display panel to instantly display the received sensing data. At the same time, the processing device 210 uploads the recorded energy data (i.e., the filtered and more significant data) to the management server 150. Therefore, user can remotely connect to the energy measurement meter 120 or the management server 150 through the control device 140 to access or analyze the energy data at any time.

In addition, user can also set various parameters of the energy measurement meter 120 or the measurement mode by operating the processing device 210 or remotely connecting to the energy measurement meter 120 through the control device 140. In one embodiment, the filtering threshold value of the data filter can be a fixed preset value or a dynamically adjusted value. For example, the processing device 210 (or through the control device 140, the management server 150) can periodically analyze the energy data of each signal type, and dynamically adjust the filtering threshold value according to the analysis result (e.g., quality level, cumulative data).

For example, the processing device 210 records an average hourly water consumption (the energy data) during the off-peak time. Every three months, the processing device 210 analyzes the average hourly water consumption during this period, and adds one-half of a standard deviation as a new filtering threshold value for the "high leakage threshold".

For another example, the processing device 210 records the "power efficiency" of device. At every preset time, the processing device 210 calculates the power efficiency with a specific ratio or function according to a cumulative operation time and a life parameters in the device specifications to generate a new filtering threshold value.

It is explained the function "Modular Configuring" of the energy measurement meter 120. As mentioned above, for the energy measurement meter 120, one processing device 210 can be coupled to multiple measurement devices 220A-220C. When the energy measurement meter 120 is activated, the processing device 210 sequentially inquires (polling) the state of each of the measurement devices 220A-220C. For example, the processing device 210 sequentially confirms the device code and state with each of the measurement devices 220A-220C. If the device code is wrong, or the state of the device code recorded in the processing device 210 and the corresponding measurement device does not match, it means that there is an abnormality in the configuration.

After confirming the device code and the state are matched, the processing device 210 obtains a predefined memory address in the corresponding measurement device to correctly obtain the sensing data. In one embodiment, the processing device 210 may also provide a time data to the measurement devices 220A-220C so that the time of the processing device 210 and the measurement devices 220A-220C is synchronized.

Figure 4:
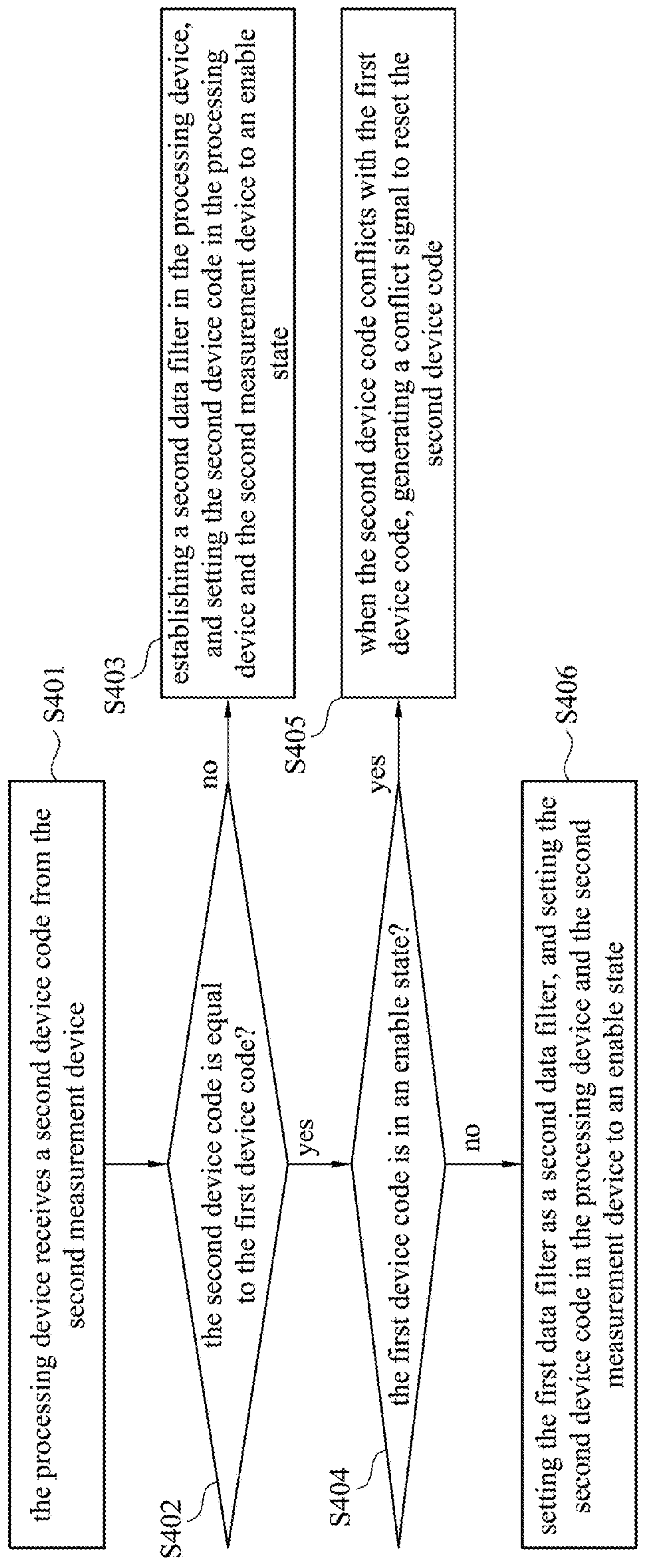
FIG. 4 is a flowchart of modular configuring in some embodiments of the present disclosure.

If the device code is not matched, the processing device 210 determines whether there is a device abnormality or whether a new device is added. FIG. 4 is a flowchart of modular configuring in some embodiments of the present disclosure. In step S401, the processing device 210 confirms the device code with each of the measurement devices 220A-220C in sequence. A second measurement device 220B has been set with a second device code and multiple channel codes. When the processing device 210 is coupled to the second measurement device 220B, the processing device 210 receives the second device code from the second measurement device 220B.

In step S402, the processing device 210 determines whether the second device code is equal to any device code stored in the processing device 210. If the second device code is not equal to any device code stored in the processing device 210, it means the second measurement device 220B is a new device, and the processing device 210 is coupled to the second measurement device 220B for the first time. At this time, in step S403, the processing device 210 establishes a second data filter (can be set remotely by the control device), and the second device code in the processing device 210 and the second measurement device 220B is set to an enable state.

The second data filter can be stored in the processing device 210 and/or the second measurement device 220B, and the processing device 210 records at least one part of the second sensing data provided by the second measurement device 220B as a second energy data according to a second data filter. The second data filter is configured to cause the energy measurement meter records at least one part of multiple second sensing data provided by the second measurement device 220B as multiple second energy data according to the second data filter. The content and application of the second data filter can be the same as the first data filter mentioned above, so it will not be described again here.

On the other hand, if the second device code is equal to the first device code stored in the processing device 210, it needs to determine whether the two device codes conflict through steps S404-S406.

In step S404, the processing device 210 determines whether the first device code is in the enable state. If the first device code is in the enable state, it means the first measurement device 220A corresponding to the first device code operates normally, and the second device code conflicts with the first device code. At this time, in step S405, the energy management system 100 transmits a conflict signal to the second measurement device 220B (or the control device 140), so as to require user to reset the second device code to resolve conflict issues.

If the first device code is in the disable state, it means the first measurement device 220A corresponding to the first device code has been removed, and the second measurement device 220B is configured to replace the first measurement device 220A. At this time, in step S406, there will be no need to establish a new data filter (second data filter), the processing device 210 will set the first data filter as the second data filter, so that the processing device integrates the sensing data provided by the first measurement device 220A and the sensing data provided by the second measurement device 220B, and records those sensing data in the same database. The second device code in the processing device 210 and the second measurement device 220B will be set to the enable state.

The energy measurement meter of the present disclosure uses the manner of "expansion module" to simultaneously collect sensing signals of different signal types (e.g., electricity, water, gas, oil) and calculate carbon emissions in real time. Accordingly, user can conveniently manage and analyze all load devices 130 to understand the current key sources of carbon emissions. At the same time, through a network connection formed by the management server 150 or the network equipment 160, user can monitor energy consumption data through the control device 140, or when the energy consumption data is abnormal, receive an immediate notification to facilitate management.

The elements, method steps, or technical features in the foregoing embodiments may be combined with each other, and are not limited to the order of the specification description or the order of the drawings in the present disclosure.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. An energy measurement meter, comprising:

a first measurement device comprising a plurality of measurement circuits, wherein the plurality of measurement circuits is coupled to a plurality of sensors through a plurality of input ports to receive a plurality of first sensing signals, and the plurality of measurement circuits is configured to convert the plurality of first sensing signals into a plurality of first sensing data; and a processing device communicatively connected to the first measurement device to receive the plurality of first sensing data from the first measurement device;

wherein the first measurement device is further configured for:

setting a first device code corresponding to the first measurement device and a plurality of channel codes corresponding to the plurality of measurement circuits;

providing the first device code and the plurality of channel codes to the processing device when communicatively connecting to the processing device; and providing the plurality of first sensing data to the processing device, so that the processing device records at least one part of the plurality of first sensing data as a plurality of first energy data, wherein each of the plurality of first energy data corresponds to the first device code and a corresponding one of the plurality of channel codes;

wherein the processing device is further configured for:

setting a first data filter when the processing device is communicatively connected to the first measurement device, wherein the first data filter comprises a plurality of signal types and a plurality of data storing criteria, the plurality of signal types corresponds to the plurality of data storing criteria, and the energy measurement meter records the at least one part of the plurality of first sensing data as the plurality of first energy data according to the first data filter;

when a second measurement device is communicatively connected to the first measurement device, receiving a second device code provided by the second measurement device;

determining whether the second device code is equal to the first device code;

setting the first data filter as a second data filter when the second device code is equal to the first device code, but the first device code is set to a disable state; and setting the second device code in the processing device and the second measurement device to an enable state after setting the second data filter, wherein the second data filter is configured to cause the energy measurement meter records at least one part of a plurality of second sensing data provided by the second measurement device as a plurality of second energy data according to the second data filter.

2. The energy measurement meter of claim 1, wherein the processing device is configured for:

setting the first device code in the processing device and the first measurement device to an enable state after setting the first data filter.

3. The energy measurement meter of claim 2, wherein the processing device is configured for:

transmitting a conflict signal to the second measurement device or a control device to reset the second device code when the second device code is equal to the first device code and the first device code is set to the enable state.

4. The energy measurement meter of claim 3, wherein the processing device is further configured for:

establishing the second data filter in the processing device when the second device code is not equal to the first device code, wherein the second data filter corresponds to the second measurement device.

5. The energy measurement meter of claim 2, wherein the first data filter further comprises a plurality of filtering threshold values corresponding to the plurality of data storing criteria, and the first measurement device is configured for:

classifying the plurality of first sensing data according to the plurality of signal types to correspond to the plurality of filtering threshold values;

wherein the processing device is further configured for:

when one of the plurality of first sensing data matches to one of the plurality of filtering threshold values, storing the one of the plurality of first sensing data as one of the plurality of first energy data corresponding to one of the plurality of signal types.

6. The energy measurement meter of claim 5, wherein the plurality of filtering threshold values is dynamically adjusted according to an analysis result of the plurality of first energy data.

7. The energy measurement meter of claim 5, wherein the processing device stores a plurality of carbon emission coefficients, the plurality of carbon emission coefficients corresponds to the plurality of signal types, and the processing device is configured for:

calculating each of the plurality of first energy data and a corresponding one of the plurality of carbon emission coefficients to collect a carbon emission data.

8. The energy measurement meter of claim 2, wherein the plurality of sensors comprises an analog flow meter, and the first measurement device is configured for:

converting an analog sensing signal provided by the analog flow meter into an analog sensing data; and sampling the analog sensing data according to a sampling accuracy to generate a digital sensing data, wherein the digital sensing data corresponds to one of the plurality of signal types, and the one of the plurality of signal types is water flow, gas flow or oil flow.

9. The energy measurement meter of claim 8, wherein the first measurement device is selectively set in one of a plurality of measurement modes, and the plurality of measurement modes corresponds to a plurality of measurement parameters and the plurality of signal types;

wherein the first measurement device is configured for:

when the first measurement device is set in a first measurement mode of the plurality of measurement modes, calculating the digital sensing data according to the sampling accuracy and a first measurement parameter of the plurality of measurement parameters to use as one of the plurality of first sensing data.

10. An energy measuring method, comprising:

when a processing device is communicatively connected to a first measurement device, setting a first device code corresponding to the first measurement device and setting a plurality of channel codes corresponding to a plurality of measurement circuits of the first measurement device;

converting, by the first measurement device, a plurality of first sensing signals provided by a plurality of sensors into a plurality of first sensing data;

receiving, by the processing device, the plurality of first sensing data, and identifying the first measurement device and the plurality of measurement circuits according to the first device code and the plurality of channel codes; and recording at least one part of the plurality of first sensing data as a plurality of first energy data, wherein each of the plurality of first energy data corresponds to the first device code and a corresponding one of the plurality of channel codes;

setting a first data filter when the processing device is communicatively connected to the first measurement device, wherein the first data filter comprises a plurality of signal types and a plurality of data storing criteria, the plurality of signal types corresponds to the plurality of data storing criteria, and the processing device records the at least one part of the plurality of first sensing data as the plurality of first energy data according to the first data filter;

receiving, by the processing device, a second device code provided by a second measurement device;

determining whether the second device code is equal to the first device code;

setting the first data filter as a second data filter when the second device code is equal to the first device code, but the first device code is set to a disable state; and setting the second device code in the processing device and the second measurement device to an enable state after setting the second data filter, wherein the second data filter is configured to cause the processing device records at least one part of a plurality of second sensing data provided by the second measurement device as a plurality of second energy data according to the second data filter.

11. The energy measuring method of claim 10, further comprising:

setting the first device code in the processing device and the first measurement device to an enable state after setting the first data filter.

12. The energy measuring method of claim 11, further comprising:

transmitting a conflict signal to the second measurement device or a control device to reset the second device code when the second device code is equal to the first device code and the first device code is set to the enable state.

13. The energy measuring method of claim 12, further comprising:

establishing the second data filter in the processing device when the second device code is not equal to the first device code, wherein the second data filter corresponds to the second measurement device.

14. The energy measuring method of claim 11, wherein the first data filter further comprises a plurality of filtering threshold values corresponding to the plurality of data storing criteria, and the energy measuring method further comprises:

classifying the plurality of first sensing data according to the plurality of signal types to correspond to the plurality of filtering threshold values; and when one of the plurality of first sensing data matches to one of the plurality of filtering threshold values, storing the one of the plurality of first sensing data as one of the plurality of first energy data corresponding to one of the plurality of signal types.

15. The energy measuring method of claim 14, further comprising:

adjusting the plurality of filtering threshold values dynamically according to an analysis result of the plurality of first energy data periodically.

16. The energy measuring method of claim 14, wherein the processing device stores a plurality of carbon emission coefficients, the plurality of carbon emission coefficients corresponds to the plurality of signal types, and the energy measuring method further comprises:

calculating each of the plurality of first energy data and a corresponding one of the plurality of carbon emission coefficients to collect a carbon emission data.

17. The energy measuring method of claim 11, wherein the plurality of sensors comprises an analog flow meter, and the energy measuring method further comprises:

converting an analog sensing signal provided by the analog flow meter into an analog sensing data; and sampling the analog sensing data according to a sampling accuracy to generate a digital sensing data, wherein the digital sensing data corresponds to one of the plurality of signal types, and the one of the plurality of signal types is water flow, gas flow or oil flow.

18. The energy measuring method of claim 17, wherein the first measurement device is selectively set in one of a plurality of measurement modes, and the plurality of measurement modes corresponds to a plurality of measurement parameters and the plurality of signal types, and the energy measuring method further comprises:

when the first measurement device is set in a first measurement mode of the plurality of measurement modes, calculating the digital sensing data according to the sampling accuracy and a first measurement parameter of the plurality of measurement parameters to use as one of the plurality of first sensing data.

19. An energy measurement meter, comprising:

a measurement device comprising a plurality of measurement circuits, wherein the plurality of measurement circuits is coupled to a power sensor and an analog sensor through a plurality of input ports to receive a power sensing signal and an analog sensing signal;

wherein the measurement device is configured to convert the power sensing signal and the analog sensing signal into a plurality of sensing data; and a processing device communicatively connected to the measurement device to receive the plurality of sensing data from the measurement device, wherein when the processing device is communicatively connected to the measurement device, the energy measurement meter is configured to set a device code corresponding to the measurement device and a plurality of channel codes corresponding to the plurality of measurement circuits;

wherein the processing device is configured to record at least one part of the plurality of sensing data as a plurality of energy data, wherein each of the plurality of energy data corresponds to the device code and a corresponding one of the plurality of channel codes;

wherein the processing device is configured for:

setting a data filter when the processing device is communicatively connected to the measurement device, wherein the data filter comprises a plurality of signal types and a plurality of data storing criteria, the plurality of signal types corresponds to the plurality of data storing criteria, and the energy measurement meter records the at least one part of the plurality of sensing data as the plurality of energy data according to the data filter; and setting the device code in the processing device and the measurement device to an enable state after setting the data filter;

wherein the processing device stores a plurality of carbon emission coefficients, the plurality of carbon emission coefficients corresponds to the plurality of signal types, and the processing device is configured for:

calculating each of the plurality of energy data and a corresponding one of the plurality of carbon emission coefficients to collect a carbon emission data.

20. The energy measurement meter of claim 19, wherein the processing device is configured to provide a driving power to the measurement device, and the measurement device generates the plurality of sensing data according to the driving power.

21. The energy measurement meter of claim 20, wherein the processing device is configured for:

converting an analog sensing signal provided by the analog sensor into an analog sensing data; and sampling the analog sensing data according to a sampling accuracy to generate a digital sensing data, wherein the digital sensing data corresponds to one of a plurality of signal types, and the one of the plurality of signal types is water flow, gas flow or oil flow.

* * * * *